(12) United States Patent
Hellwig et al.

(10) Patent No.: US 7,423,568 B2
(45) Date of Patent: Sep. 9, 2008

(54) SIGMA DELTA MODULATOR

(75) Inventors: Wolfgang Hellwig, Gomaringen (DE); Martin Wrede, Reutlingen (DE); Gerhard Wucher, Reutlingen (DE); Dirk Droste, Tuebingen (DE); Thomas Walker, Kusterdingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 11/629,826

(22) PCT Filed: May 31, 2005

(86) PCT No.: PCT/EP2005/052476
§ 371 (c)(1),
(2), (4) Date: Dec. 14, 2006

(87) PCT Pub. No.: WO2006/008207
PCT Pub. Date: Jan. 26, 2006

(65) Prior Publication Data
US 2007/0236373 A1    Oct. 11, 2007

(30) Foreign Application Priority Data
Jul. 17, 2004    (DE) .................. 10 2004 034 674

(51) Int. Cl.
*H03M 3/00*    (2006.01)

(52) U.S. Cl. ..................... 341/143; 341/155
(58) Field of Classification Search ............... 341/143, 341/144, 155; 324/658
See application file for complete search history.

(56) References Cited

U.S. PATENT DOCUMENTS

| | | | | |
|---|---|---|---|---|
| 5,454,266 A | * | 10/1995 | Chevroulet et al. | 73/514.18 |
| 5,623,432 A | * | 4/1997 | Degrauwe | 713/321 |
| 7,235,983 B2 | * | 6/2007 | O'Dowd et al. | 324/658 |

OTHER PUBLICATIONS

Smith, T. et al., "A 15B Electromechanical Sigma-Delta Converter for Acceleration Measurements", IEEE International Solid State Circuits Conference, IEEE Inc. New York, vol. 37, Feb. 1, 1994, pp. 160-161, 330.

Kulah, H. et al., "A CMOS switched-capacitor interface for an integrated accelerometer", Proceedings of the 43rd IEEE Midwest Symposium on Circuits and Systems MWSCAS 2000, Lansing, MI, Aug. 8-11, 2000, Midwest Symposium on Circuits and Systems, New York, vol. 1 of 3, Aug. 8, 2000, pp. 244-247.

* cited by examiner

*Primary Examiner*—Brian Young
(74) *Attorney, Agent, or Firm*—Kenyon & Kenyon LLP

(57) ABSTRACT

A circuit for converting the capacitive signal change of a differential capacitor into digital signals, the circuit including a sigma delta modulator. The differential capacitor is a component of the signal feed structure and the reference feedback structure of the sigma delta modulator.

9 Claims, 4 Drawing Sheets

SIGMA DELTA MODULATOR

FIELD OF THE INVENTION

The present invention relates to a circuit for converting the capacitive signal change of a differential capacitor to digital signals, the circuit including a sigma delta modulator.

BACKGROUND INFORMATION

Acceleration sensors are produced using micromechanical differential capacitors, among other things. In this context, a capacitive signal change is caused by the deflection x of the common electrode (designated as seismic mass in the following). Deflection x may be created by accelerations acting from outside, or by electrostatic field forces applied within the system. For partial capacitances C1 and C2, the capacitive change amounts to:

$$C1=\epsilon*A/(d+x), C2=\epsilon*A/(d-x).$$

In this context, $\epsilon$ is the dielectric constant, A is the capacitor surface formed by the electrodes and d is the distance between the plates of the electrodes. Typical read-out circuits for recording these capacitive signal changes use switched capacitor circuit engineering in order to convert a charge generated by reference voltages, that is a function of the capacitive signal change, by integration to a voltage, and subsequently to a digital pulse code-modulated signal (PCM signal). In this context, there are generally two architectures for converting the analog capacitive signal to a voltage and subsequently to digitize it. Both approaches, in this context, generate a conversion of the capacitive signal to a voltage by a charge amplifier.

In the first approach, this voltage is digitized. In this connection, there is the possibility of undertaking a Nyquist conversion after filtering the voltage, or a modulation conversion of the voltage without filtering. In the case of the modulation conversion, the differential capacitor can be a component of the signal feed structure of a classical sigma delta converter.

In the second approach, the signal is digitized by a modulated, mechanically closed control circuit with the aid of a sigma delta modulation. In this context, the controlled variable is the resulting dynamic effect on the seismic mass of the differential capacitor.

SUMMARY

The present invention relates to a circuit for converting the capacitive signal change of a differential capacitor to digital signals, the circuit including a sigma delta modulator. According to the present invention, the differential capacitor is a component of the signal feed structure and the reference feedback structure of the sigma delta modulator.

It may be advantageous, in this connection, if a capacity change is converted directly from an analog value into a digital signal, especially a bit stream. An advantage may also lie in the improvement of the noise properties compared to the second approach introduced in the related art, and in the improvement of the linearity of the output signal compared to the first approach introduced in the related art. Properties of noise and linearity are improved with respect to both approaches. Because of the integration of the differential capacitor into the signal feed structure and the reference feedback structure of the sigma delta converter, the output signal of the converter in the form of a binary stream becomes, in a first approximation, only a function of the deflection of the seismic mass of the differential capacitor, and is therefore a mass that is proportional to the acceleration acting on the seismic mass.

$$PCM=k*(C1-C2)/(C1+C2)\sim x/d.$$

In one advantageous embodiment of the present invention, the circuit also has a decimating filter, besides the sigma delta modulator, and consequently represents a sigma delta converter. Using a decimating filter, the scanning rate at the output may be reduced, and the digital signal may be represented using a word having a certain bit number (word length).

A further advantageous embodiment of the present invention includes an arrangement by which various reference voltages are able to be applied to the electrodes (C1E, CME, C2E) of the differential capacitor, and the reference voltages are selectable in a certain pattern in time having a certain amplitude. Because of variously selected reference voltages, various value ranges and resolutions may be represented of the signal that is to be digitized. In addition, because of this, advantageous refinements of the present invention become possible.

A first advantageous refinement of the present invention provides that a polarity change of the input signal is implemented because of a suitably selected sequence of the reference voltages at the electrodes (C1E, CME, C2E). In this connection the possibility is of advantage of eliminating a possible offset of the signal processing chain by modulation of the input signal.

$$PCM=\pm k*(C1-C2)/(C1+C2)\sim x/d.$$

Advantageously, the offset of the signal processing of the circuit is eliminated because of the synchronous modulation of the digital signals at the output of the converter.

An additional advantageous embodiment of the present invention includes that, by a suitable selection of the reference voltages at the electrodes (C1E, CME, C2E), an equipotentiality of the electrodes is fulfilled on average in time. An advantage of the second advantageous refinement of the present invention lies in the possibility of preventing the electrical charging with time of the seismic mass and the change in the output signal created thereby.

$$\int \phi C1E(t)dt \sim \int \phi C2E(t)dt \sim \int \phi CME(t)dt$$

Another advantage is that one electrode (CME) is movable and that the structure records at least one deflection, caused by electrostatic field forces, of the movable electrode (CME) as input of an autotest function. In response to a suitable selection of the reference voltages and a suitable clocking scheme for applying these reference voltages to the electrodes (C1E, CME, C2E), an actuating force may be exerted on the electrode (CME). The deflection of the electrode that occurs as a result may be evaluated within the scope of an autotest function.

BRIEF DESCRIPTION OF THE DRAWINGS

Exemplary embodiments of the present invention are illustrated in the drawings and are explained in greater detail below.

DESCRIPTION OF EXAMPLE EMBODIMENTS

The present invention is represented in detail on the basis of example embodiments described below.

Figure 1:
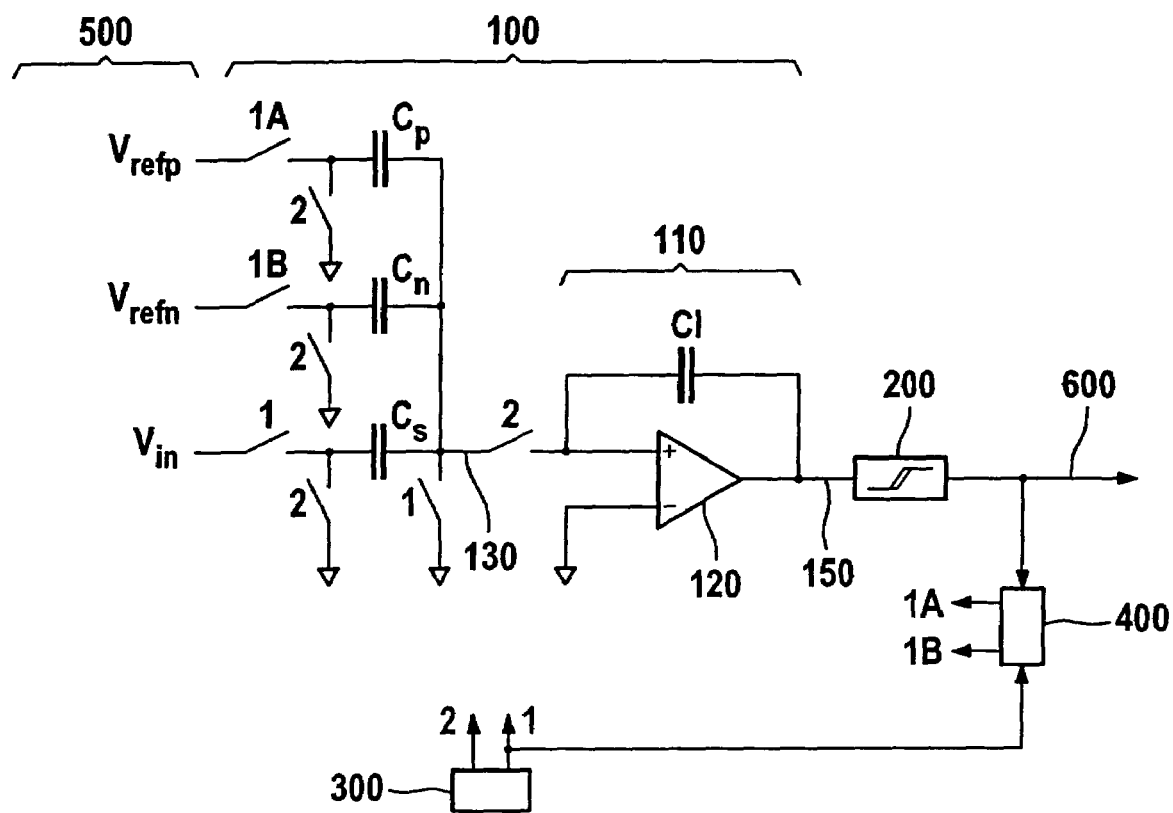
FIG. 1 shows a conventional sigma delta modulator.

FIG. 1 shows a conventional sigma delta modulator. The circuit configuration shows a single-pole grounded signal path. The sigma delta modulator has an integrator having switched capacitor 100 (in English, SC integrator), a comparator 200, a clock pulse generator 300, a switching unit 400, three voltage inputs 500 and an output 600. At voltage inputs 500, a positive reference voltage $V_{refp}$, a negative reference voltage $V_{refn}$ and an input voltage $V_{in}$ are present.

Thus, the voltage supply takes place in the form of input voltage $V_{in}$. Integrator 100 has a first switching element at the voltage input having the positive reference voltage $V_{refp}$, which can be closed using a signal 1A. An additional switching element is connected to this output of this first switching element, which is able to be closed using a signal 2, and which thereby produces a ground connection. The output of the first switching element is also connected to a capacitor $C_p$. Integrator 100 has a second switching element at the voltage input having the negative reference voltage $V_{refn}$, which can be closed using a signal 1B. An additional switching element is connected to this output of this second switching element, which is able to be closed using a signal 2, and which thereby produces a ground connection. The output of the first switching element is also connected to a capacitor $C_n$. Integrator 100 has a third switching element at the voltage input having the input voltage $V_{in}$, which is able to be closed using a signal 1. An additional switching element is connected to the output of this third switching element, which is able to be closed using a signal 2, and which thereby produces a ground connection. The output of the third switching element is also connected to a capacitor $C_S$. The outputs of capacitors $C_p$, $C_n$ and $C_S$ are connected to one another and conduct a signal 130 on to a switching element, which is able to be closed using a signal 2. Signal 130 is thereby supplied to an integration member 110. Integration member 110 includes a capacitor C1 and an amplifier 120. Integration member 110 makes available, at its output, an analog output voltage $V_{out}$ in the form of a signal 150, which is supplied to a threshold value switch, in this example, a comparator 200. The comparator makes available a binary stream 600 at its output. The sigma delta modulator also has a clock pulse generator 300, which has two outputs. The clock pulse generator at both outputs emits clock pulse signals 1 and 2 in a non-overlapping 2-phase clock pulse. Finally, the sigma delta modulator has a switching unit 400, which has two signal inputs and 2 signal outputs. Binary stream 600 and clock pulse signal 2 are present at the signal inputs. Switching signals 1A and 1B are made available at the signal outputs.

Figure 2:
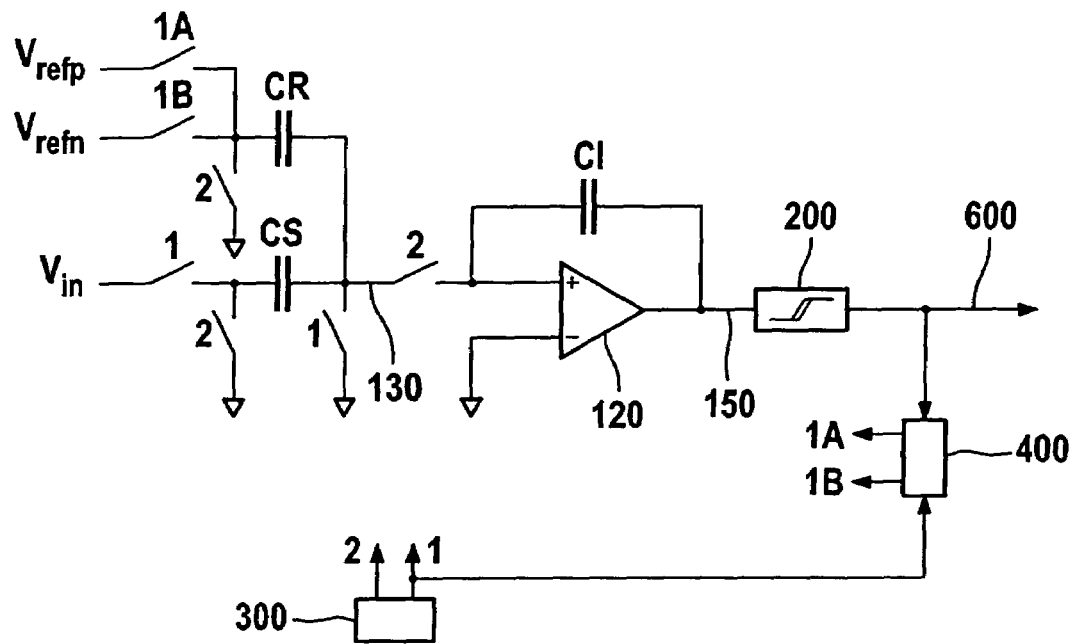
FIG. 2 shows an additional conventional sigma delta modulator.

FIG. 2 shows an additional sigma delta modulator according to the related art. The sigma delta modulator according to FIG. 1 has been slightly modified. The functions of switched capacitors $C_p$ and $C_n$ are shown here by a common capacitor CR.

Figure 3:
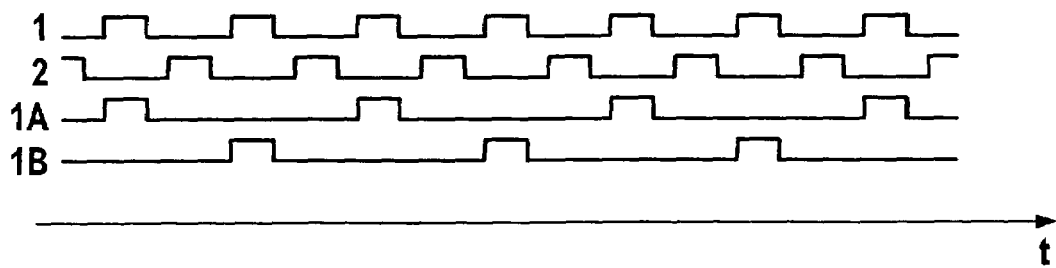
FIG. 3 shows the clocking scheme for the conventional sigma delta modulator of FIG. 1 or FIG. 2.

FIG. 3 shows the clock pulse scheme for a sigma delta modulator according to the related art, as in FIG. 1 or FIG. 2. The logical conditions H (active) and L (inactive) are shown with respect to a common time axis t. Clock pulse signals 1 and 2 represent a non-overlapping 2-phase clock pulse. Switching signals 1A and 1B are generated in switching unit 400 according to the following logical rules:

1A=H, if clock pulse signal 1=H AND binary stream 600=H
1B=H, if clock pulse signal 1=H AND binary stream 600=L Clock pulse signals 1A and 1B represent a signal feedback from binary stream 600 at the output of the sigma delta modulator, via switching unit 400, via the switching elements that switch on voltages $V_{refp}$ and $V_{refn}$, and via capacitors C1 and C1 to input signal 130 of integration member 110. Thus, capacitors C1 and C1 are components of the reference feedback structure.

If the clock pulse scheme, that was explained here is applied to a conventional sigma delta modulator, as in FIG. 1, one obtains for the output voltage ($V_{out}$) 150 in the clock unit n+1 after clock unit n:

If 1A=H applies, then $$V_{out}n+1 = V_{out}n + (C1/C2)*V_{in} + (C_p/C2)*V_{refp},$$

If 1B=H applies, then $$V_{out}n+1 = V_{out}n + (C1/C2)*V_{in} + (C_n/C2)*V_{refn}.$$

Figure 4:
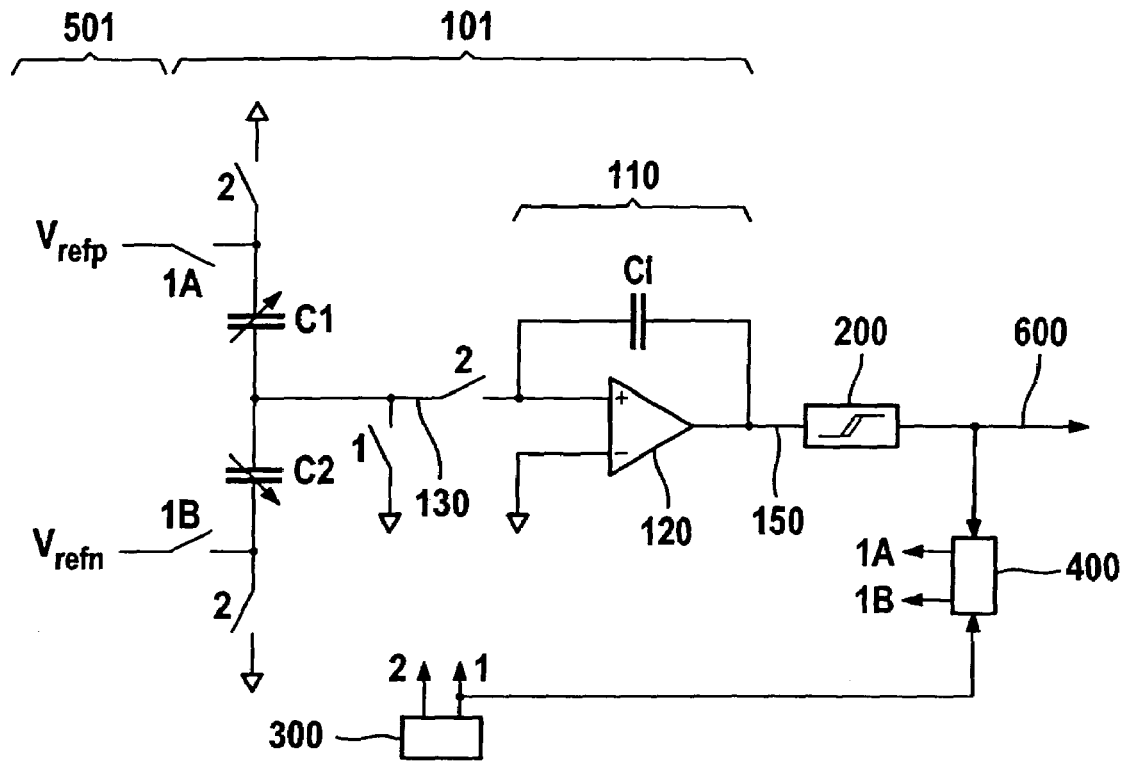
FIG. 4 shows an example sigma delta modulator according to the present invention, having a differential capacitor.

FIG. 4 shows a sigma delta modulator according to an example embodiment of the present invention, having a differential capacitor. In deviation from the sigma delta modulator shown in FIG. 1, this one shows only two voltage inputs 501, to which the voltages $V_{refp}$ and $V_{refn}$ are applied. An input voltage $V_{in}$ is not provided. Condenser CS is also omitted. Fixed capacitors $C_p$ and $C_n$ are now shown in the sigma delta modulator according to the present invention by capacitors C1 and C2 of a differential capacitor. Such a differential capacitor may be, for example, a capacitive measurement detector of a micromechanical acceleration sensor. Thus, the signal supply takes place in the form of variable capacitors C1 and C2 of the differential capacitor. This means that the differential capacitor is a part of the signal supply structure. Furthermore, the clocking scheme is used that was shown in FIG. 3.

The sigma delta modulator according to the example embodiment of the present invention converts the changes in the analog differential capacities into a bit stream 600.

The following equations apply for the differential capacities:

$$C1 = CO*((e*A)/(\Delta d + d))$$

$$C2 = CO*((e*A)/(\Delta d - d))$$

The following equations apply in approximation:

$$C1 = CO - \Delta AC$$

$$C2 = CO + \Delta C$$

The differential capacitor completely replaces the signal supply structure and the reference feedback structure of a typical integrator stage of a sigma delta modulator that are known in principle. In this context, the present invention may also be executed in a single-pole grounded signal path as in a double-pole signal path. In all the explanations given here, a single-pole grounded signal path is assumed.

A binary stream is generated at the output of the comparator by the regulation of the sigma delta modulator and the simultaneous application of the differential capacitor in the signal supply and the reference feedback of the modulator. The weighting of binary stream 600 of the modulator corresponds to the relationship:

$$PCM = k*(C1-C2)/(C1+C2) = \Delta d/d.$$

This relationship makes clear the linearity of the output signal with respect to the deflection of the seismic mass.

Figure 5:
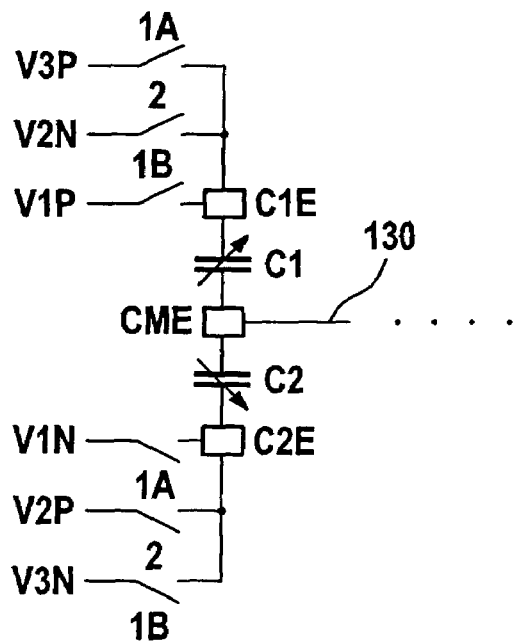
FIG. 5 shows a circuit for the feedback of various reference voltages into a sigma delta modulator according to an example embodiment of the present invention.

FIG. 5 shows a circuit for the feedback of various reference voltages into a sigma delta modulator according to an example embodiment of the present invention. What is shown is the switching operation of a sigma delta modulator, according to the example embodiment of the present invention, of the voltage inputs of the reference voltages up to signal 130. As shown in FIG. 5, various reference voltages are connected at various times to electrodes C1E, CME and C2E of a differential capacitor, made up of the partial capacities C1 and C2. The various reference voltages are designated as V×P and V×N, with x∈(1,2,3) and V×P=−V×N, with x∈(1,2,3), the various times are specified from clock pulse signals 1A, 1B and 2 that are shown in FIG. 2. The times represent the known 2-phase clock pulse, the distinction A and B of phase 1 being made as a function of bit stream 600 at the output of comparator 200 of the sigma delta modulator in switching unit 400.

Figure 6:
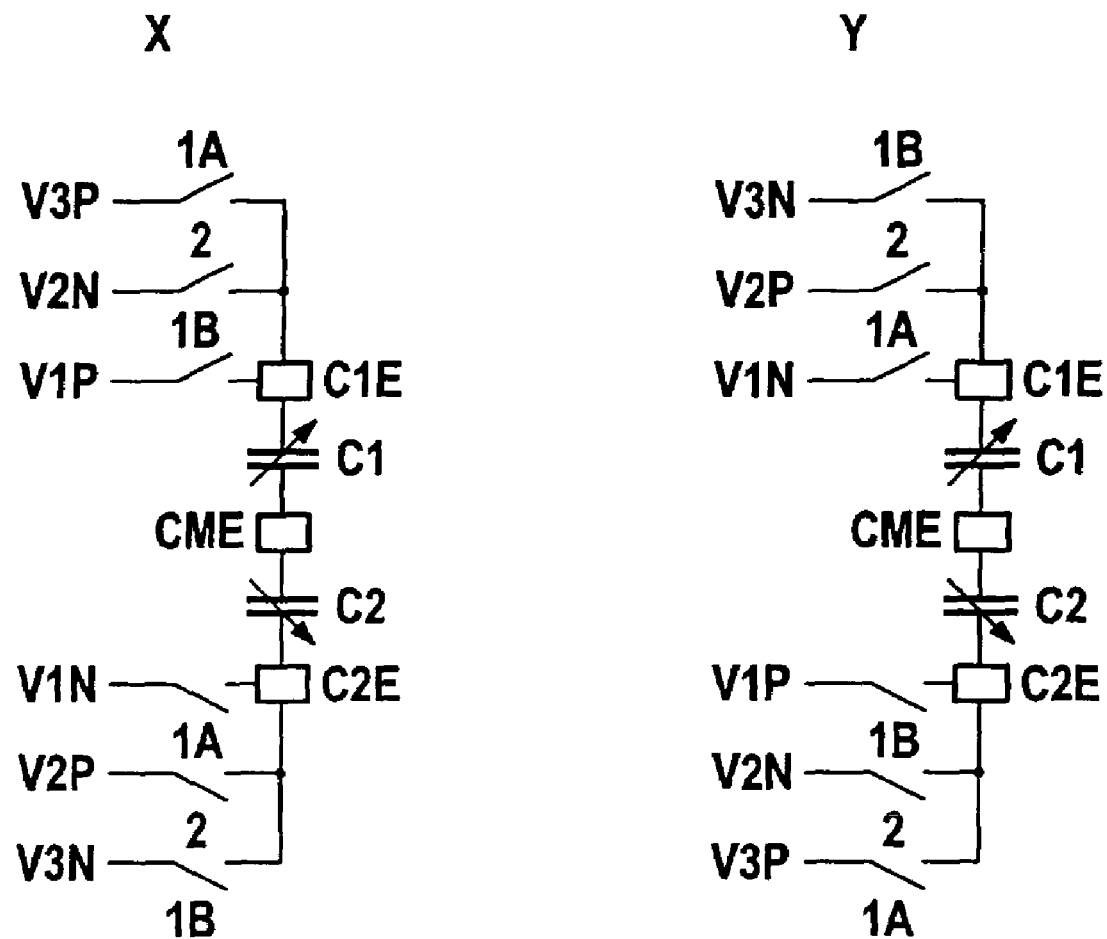
FIG. 6 shows a circuit for the exchange of various reference voltages in a sigma delta modulator according to an example embodiment of the present invention.

FIG. 6 shows a circuit for the feedback of various reference voltages into a sigma delta modulator according to an example embodiment of the present invention. A first advantageous refinement of the present invention makes possible a modulation in which the patterns of activation A and B are broadened by patterns X and Y. In this context, according to FIG. 6, reference voltages V×N and V×P are mutually exchanged as a function of the exchange of X and Y at electrodes C1E and C2E, and at the same time the modulator output-dependent states A and B are mutually exchanged. The exchange of the reference voltages and the states takes place, for example, using a switching unit that is not shown here in greater detail. The change in time of states X and Y, in this context, corresponds to a frequency that is different from the modulation frequency of the sigma delta modulator. At the output of the comparator a binary stream 600 is created, having the relationship:

$$PCM = \pm|_{x,y} k^* (C1-C2)/(C1+C2) \sim \pm|_{x,y} \Delta d/d.$$

As a function of the state X or Y, a polarity change of the PCM signal is created, so that a signal offset of the signal processing may be eliminated within the sigma delta modulator, because of the subsequent digital synchronous demodulation using the modulation frequency of states X and Y.

Another advantageous refinement of the present invention, according to FIG. 5, makes possible the equipotentiality of electrodes C1E, CME and C2E integrated over time. For this, reference voltage V2P and V2N are selected as:

$$V2P=0.5^*(V1P+V3P),$$

$$V2N=0.5^*(V1N+V3N).$$

Because of the distribution of states A and B that is balanced on average, a sequence of reference voltages is connected to each electrode, which on average over time causes a high equipotentiality of C1E, CME and C2E.

$$\int \phi C1E(t)dt \sim \int \phi C2E(t)dt \sim \int \phi CME(t)dt$$

A third advantageous refinement of the present invention makes possible a deflection of the seismic mass from the normal position by applying electrical fields inside capacitors C1 and C2, using test voltages. This may be done by superposition of additive test voltages over voltages V×P and V×N, or by applying test voltages and applying the read-out voltages V×P and V×N in time division multiplex.

Furthermore, other advantageous refinements are also possible.

According to another example embodiment of the present invention, a sigma delta modulator includes a differential capacitor. In this embodiment, the acceleration sensor is made up of a micromechanical functional part and an evaluation unit. The micromechanical functional part includes a seismic mass, which is suspended on a fixed part using spring elements. The seismic mass may be deflected by outside accelerations along a sensitive axis. Besides that, micromechanical functional part has at least two fixed electrodes. Seismic mass has an electrode which is movable with the seismic mass with respect to the fixed electrodes. The movable electrode forms a the variable capacity with a fixed electrode and forms a variable capacity with a fixed electrode. The electrodes together form a differential capacitor. They are connected to an evaluation unit using electrical leads. The differential capacitor and the evaluation unit together represent a sigma delta modulator according to an example embodiment of the present invention.

Furthermore, other exemplary embodiments are also possible. In particular, the sigma delta modulator according to the present invention is also able to be used in rotation rate sensors.

What is claimed is:

1. A circuit for converting a capacitive signal change of a differential capacitor into digital signals, comprising:
   a sigma delta modulator having a signal supply structure and a reference feedback structure, the differential capacitor being a component of the signal supply structure and the reference feedback structure;
   wherein an offset of signal processing of the circuit is eliminated because of a synchronous demodulation of the digital signals at an output of the circuit.

2. The circuit as recited in claim 1, further comprising:
   a decimating filter, wherein the circuit is a sigma delta converter.

3. The circuit as recited in claim 1, further comprising:
   an arrangement configured to provide reference voltages to electrodes of the differential capacitor.

4. A circuit for converting a capacitive signal change of a differential capacitor into digital signals, comprising:
   a sigma delta modulator having a signal supply structure and a reference feedback structure, the differential capacitor being a component of the signal supply structure and the reference feedback structure; and
   an arrangement configured to provide reference voltages to electrodes of the differential capacitor;
   wherein the reference voltages are selectable in a certain pattern in time having a certain amplitude.

5. A circuit for converting a capacitive signal change of a differential capacitor into digital signals, comprising:
   a sigma delta modulator having a signal supply structure and a reference feedback structure, the differential capacitor being a component of the signal supply structure and the reference feedback structure; and
   an arrangement configured to provide reference voltages to electrodes of the differential capacitor;
   wherein a polarity change in an input signal is implemented by a selected sequence of the reference voltages at the electrodes.

6. A circuit for converting a capacitive signal change of a differential capacitor into digital signals, comprising:
   a sigma delta modulator having a signal supply structure and a reference feedback structure, the differential capacitor being a component of the signal supply structure and the reference feedback structure; and an arrangement configured to provide reference voltages to electrodes of the differential capacitor;

wherein an equipotentiality of the electrodes on average in time is given by a selection of the reference voltages at the electrodes.

7. A circuit for converting a capacitive signal change of a differential capacitor into digital signals, comprising:

a sigma delta modulator having a signal supply structure and a reference feedback structure, the differential capacitor being a component of the signal supply structure and the reference feedback structure; and an arrangement configured to provide reference voltages to electrodes of the differential capacitor;

wherein one of the electrodes is movable, and the circuit records at least one deflection, caused by electrostatic field forces, of the movable electrode as an input signal of an autotest function.

8. A capacitive sensor, comprising:

at least one movable electrode;

at least two fixed electrodes which form a differential capacitor, the movable electrode and the fixed electrodes forming a differential capacity; and a circuit for converting a capacitive change of the differential capacitor into digital signals, the circuit including a sigma delta modulator having a signal supply structure and a reference feedback structure, the differential capacitor being a component of the signal supply structure and the reference feedback structure;

wherein an offset of signal processing of the circuit is eliminated because of a synchronous demodulation of the digital signals at an output of the circuit.

9. The capacitive sensor as recited in claim 8, wherein an acceleration sensor is involved.

* * * * *